United States Patent
Takeda et al.

(10) Patent No.: US 8,680,543 B2
(45) Date of Patent: Mar. 25, 2014

(54) LIGHT EMITTING ELEMENT HAVING A CAPPING LAYER ON AN ELECTRODE, LIGHT EMITTING DEVICE HAVING THE SAME AND METHOD FOR MANUFACTURING THE SAME

(75) Inventors: Keizo Takeda, Yamato (JP); Tomoko Murakami, Yasu (JP)

(73) Assignee: LG Display Co., Ltd., Seoul (KR)

( * ) Notice: Subject to any disclaimer, the term of this patent is extended or adjusted under 35 U.S.C. 154(b) by 994 days.

(21) Appl. No.: 11/902,341

(22) Filed: Sep. 20, 2007

(65) Prior Publication Data

US 2008/0023724 A1    Jan. 31, 2008

Related U.S. Application Data

(63) Continuation of application No. PCT/JP2006/305852, filed on Mar. 23, 2006.

(30) Foreign Application Priority Data

Mar. 24, 2005   (JP) ................... 2005-086975
Mar. 22, 2006   (JP) ................... 2006-079634
Mar. 22, 2006   (JP) ................... 2006-079635

(51) Int. Cl.
   *H01L 29/20*      (2006.01)
   *H01L 33/00*      (2010.01)

(52) U.S. Cl.
   USPC ............ 257/89; 257/40; 257/88; 257/79; 257/E33.055; 257/E51.022

(58) Field of Classification Search
   USPC .......................... 257/40, 79, 88, 89
   See application file for complete search history.

(56) References Cited

U.S. PATENT DOCUMENTS

| | | | | |
|---|---|---|---|---|
| 5,554,911 A * | 9/1996 | Nakayama et al. | ........... | 313/504 |
| 6,660,409 B1 | 12/2003 | Komatsu et al. | | |
| 7,019,331 B2 * | 3/2006 | Winters et al. | ........... | 257/79 |
| 7,449,831 B2 * | 11/2008 | Aziz et al. | ........... | 313/504 |
| 7,816,857 B2 * | 10/2010 | Ryu et al. | ........... | 313/504 |

(Continued)

FOREIGN PATENT DOCUMENTS

| CN | 1797810 A | 7/2006 |
|---|---|---|
| JP | 2002-25765 A | 1/2002 |

(Continued)

OTHER PUBLICATIONS

Riel et al., "Phosphorescent top-emitting organic light-emitting devices with improved light outcoupling," Applied Physics Letters, vol. 82, No. 3, 2003, pp. 466-468.

(Continued)

*Primary Examiner* — S. V. Clark
*Assistant Examiner* — Jesse Y Miyoshi
(74) *Attorney, Agent, or Firm* — Birch, Stewart, Kolasch & Birch, LLP

(57) ABSTRACT

A light emitting element comprises a first electrode, a second electrode configured to transmitting light, an organic layer arranged between the first and the second electrodes, comprising a light emitting layer, and a capping layer arranged on the second electrode and made of a material with a higher refractive index than the refractive index of the material constituting the second electrode. The material constituting the capping layer comprises at least one selected from the group consisting of triarylamine derivative, carbazole derivative, benzimidazole derivative and triazole derivative.

9 Claims, 7 Drawing Sheets

(56) References Cited

U.S. PATENT DOCUMENTS

| | | |
|---|---|---|
| 8,212,269 B2 * | 7/2012 | Karg et al. .................. 257/98 |
| 2004/0021415 A1 | 2/2004 | Vong et al. |
| 2004/0054174 A1 * | 3/2004 | Nakaya et al. .............. 544/99 |
| 2004/0075382 A1 | 4/2004 | Stegamat et al. |
| 2005/0110400 A1 * | 5/2005 | Nakamura ................. 313/506 |
| 2006/0113907 A1 | 6/2006 | Im et al. |

FOREIGN PATENT DOCUMENTS

| | | |
|---|---|---|
| JP | 2003-257622 A | 9/2003 |
| JP | 2004-63466 A | 2/2004 |
| JP | 2004-146379 A | 5/2004 |
| JP | 2005-19407 A | 1/2005 |
| KR | 2006-59068 A | 6/2006 |
| WO | WO 2005/071770 A2 | 8/2005 |

OTHER PUBLICATIONS

Hung et al., "Application of an ultrathin LiF/Al bilayer in organic surface-emitting diodes," Applied Physics Letters, vol. 78, No. 4, 2001, pp. 544-546.

* cited by examiner

1 Light Emitting Element
10 Substrate
11 Anode
12 Hole Transport Layer
13 Light Emitting Layer
14 Electron Transport Layer
15 Semi-transparent cathode
16 Capping Layer

LIGHT EMITTING ELEMENT HAVING A CAPPING LAYER ON AN ELECTRODE, LIGHT EMITTING DEVICE HAVING THE SAME AND METHOD FOR MANUFACTURING THE SAME

CROSS-REFERENCE TO RELATED APPLICATIONS

The present application is a continuation of PCT Application No. PCT/JP2006/305852, filed on Mar. 23, 2006, entitled "LUMINESCENT ELEMENT, LIGHT EMITTING DEVICE COMPRISING SAID LUMINESCENT ELEMENT, AND PROCESS FOR PRODUCING THE SAME", which claims priority to Japanese Patent Application Nos. 2005-086975, 2006-079634, and 2006-079635, filed on Mar. 24, 2005, Mar. 22, 2006, and Mar. 22, 2006, respectively. The contents of this PCT application are incorporated herein by reference in their entirety.

BACKGROUND OF THE INVENTION

1. Field of the Invention

The present invention relates to a light emitting element which is used in organic electroluminescent display devices, a light emitting device comprising the light emitting element, and a method for manufacturing the same.

2. Description of the Related Art

An organic electroluminescent (EL) display device has properties such as thin type, wide viewing angle, low power consumption and excellent moving picture display and has been expected to be an image display device of the next generation. An organic electroluminescent element (hereinafter, referred to as "light emitting element") which is used for the organic EL display device, has at least one light emitting layer between two electrodes such that the light emitting layer emits the light by applying the voltage between the electrodes and can display an image.

Until now, a light emitting element with a bottom emission structure emitting light from the bottom part has been produced by laminating a transparent electrode as an anode such as ITO (Indium Tin Oxide), a charge transport layer, a light emitting layer comprising organic compounds, and a cathode comprising metal such as Al sequentially onto a glass substrate.

Recently, a light emitting element with a top emission structure emitting light from the upper part has become more commonly used. The top emission structure utilizes metal having high work function for the anode. Unlike the light emitting element with the bottom emission structure of which the area of the light emitting part is limited depending on the pixel circuit, the light emitting element with top emission structure has advantage in widening the area of the light emitting part. As for the light emitting element with the top emission structure, a semi-transparent electrode such as LiF/Al/Ag (Applied Physics Letters, United States, 2001, vol. 78, pp. 544-546, hereinafter referred to as 'Non-patent literature 1'), Ca/Mg (Applied Physics Letters, United States, 2003, vol. 82, pp 466-468, hereinafter referred to as 'Non-patent literature 2') or LiF/MgAg is used for the cathode. The contents of these publications are incorporated herein by reference in their entirety. When the emitted light from the light emitting layer enters the other layer with an incident angle larger than a certain value in this light emitting device, the light is totally reflected on the interface between the light emitting layer and the other layer thickness. For this reason, it cannot be avoided that only a part of the emitted light is used.

Recently, it has been proposed the light emitting device which is provided with a capping layer having a high refractive index, on the outside of the semi-transparent electrode having a low refractive index so as to improve the light extraction efficiency (Non-patent literature 1, 2).

Non-patent literature 2 discloses the effect of the capping layer in the light emitting element with a top emission structure. According to the Non-patent literature 2, a light emitting element using $Ir(ppy)_3$ (fac-tris-(2-phenylpyridinato)indium) as a light emitting material, showed 38 cd/A of current efficiency when the light emitting element was not provided with a capping layer, while the light emitting element provided with a capping layer made of ZnSe (layer thickness 60 nm), showed 64 cd/A of current efficiency which is about 1.7 times higher.

Furthermore, the Non-patent literature 2 discloses that the maximum point of transmittance of the semi-transparent electrode and capping layer is not necessarily coincident with the maximum point of light extraction efficiency of the semi-transparent electrode and capping layer, thus it is indicated that the maximum point of light extraction efficiency is determined by an interference effect.

It has been proposed that a metal mask with a high accuracy is used for forming a capping layer, however the metal mask has a problem of being inferior in alignment accuracy due to the deformation by heat. That is, ZnSe used in the Non-patent literature 2 has a high melting point as 1100° C. or more, so it is difficult to be deposited on the accurate position with the mask having a high accuracy. Most of inorganic compounds are not suitable when using the mask having a high accuracy and also may inflict damage on the light emitting element itself, due to the high deposition temperature. Moreover, since forming an inorganic layer by the sputter method may inflict damage on the light emitting element, the inorganic compounds are difficult to be applied for a capping layer.

According to the Non-patent literature 1, Tris-(8-hydroxyquinolinato)aluminum ($Alq_3$) is used as a capping layer for adjusting the refractive index. $Alq_3$ is known for an organic EL material showing green light emitting and weakly absorbs light having a wavelength of about 450 nm which is the wavelength of general blue light used for a general blue light emitting element, as shown in FIG. 8. For this reason, both color purity and light extraction efficiency decrease in the blue light emitting element. FIG. 8 is a graph showing the relation of refractive index and extinction coefficient to wavelength in the capping layer using $Alq_3$. In FIG. 8, the solid line depicts refractive index and the broken line depicts extinction coefficient.

SUMMARY OF THE INVENTION

According to one aspect of the invention, a light emitting element comprises a first electrode; a second electrode configured to transmit light, an organic layer arranged between the first and the second electrodes, comprising a light emitting layer; and a capping layer arranged on the second electrode and made of a material with a higher refractive index than the refractive index of the material constituting the second electrode. The material constituting the capping layer comprises at least one selected from the group consisting of triarylamine derivative, carbazole derivative, benzimidazole derivative and triazole derivative.

According to another aspect of the invention, a first light emitting device comprises a plurality of the light emitting elements which are at least classified into a first light emitting element, a second light emitting element which emits light in a different color from the first light emitting element, and a third light emitting element which emits light in a different color from the first and the second light emitting elements. The capping layers of the first, the second, and the third light emitting elements have respectively different thickness from each other.

According to another aspect of the invention, a first method for manufacturing the first light emitting device in which the capping layers of the light emitting elements are made of a homogeneous material comprises depositing the material constituting the capping layer onto the second electrodes of the first and the second light emitting elements, to form a first layer onto the second electrodes of the first light emitting element, and to form the capping layer onto the second electrode of the second light emitting element, respectively. The first method also comprises depositing the material constituting the capping layer onto the first layer and onto the second electrode of the third light emitting element, respectively, to form the capping layer onto the second electrodes of the first and the third light emitting elements.

According to another aspect of the invention, a second method for manufacturing a light emitting device comprises providing a substrate and a first, a second, and a third light emitting elements on the substrate. Each of the light emitting elements comprises a first electrode, a second electrode transmitting the light, and an organic layer arranged between the first and second electrodes and comprising a light emitting layer. Each of the light emitting elements also comprises a capping layer arranged on the second electrode and made of a material with a higher refractive index than the refractive index of the material constituting the second electrode and with a bandgap of 3.2 eV or higher. The second method also comprises depositing the material constituting the capping layer onto the second electrode of the first and the second light emitting elements, to form a first layer onto the second electrode of the first light emitting element and to form the capping layer onto the second electrode of the second light emitting element respectively. The second method further comprises depositing the material constituting the capping layer onto the first layer of the first light emitting element and onto the second electrode of the third light emitting element respectively, to form the capping layer onto the second electrode of the first and the third light emitting elements.

According to one aspect of the invention, a second light emitting device comprises a plurality of light emitting elements. Each of the light emitting elements comprises a first electrode, a second electrode transmitting the light, an organic layer arranged between the first and the second electrodes and comprising a light emitting layer. Each of the light emitting elements also comprises a capping layer arranged on the second electrode and made of a material with a higher refractive index than the refractive index of the material constituting the second electrode and with a bandgap of 3.2 eV or higher. The light emitting elements are classified into a first light emitting element emitting red light, a second light emitting element emitting green light, and a third light emitting element emitting blue light. When the thickness of the capping layer of the first light emitting element ($d_R$), the thickness of the capping layer of the second light emitting element ($d_G$), and the thickness of the capping layer of the third light emitting element ($d_B$) are different from each other.

DESCRIPTION OF THE PREFERRED EMBODIMENT

Hereinafter, exemplary embodiments of a light emitting element, a light emitting device comprising the light emitting element, and a method for manufacturing the same according to the present invention will be explained in detail with reference to the drawings. However, the present invention is not limited by the embodiments described below.

[Light Emitting Element]

Figure 1:
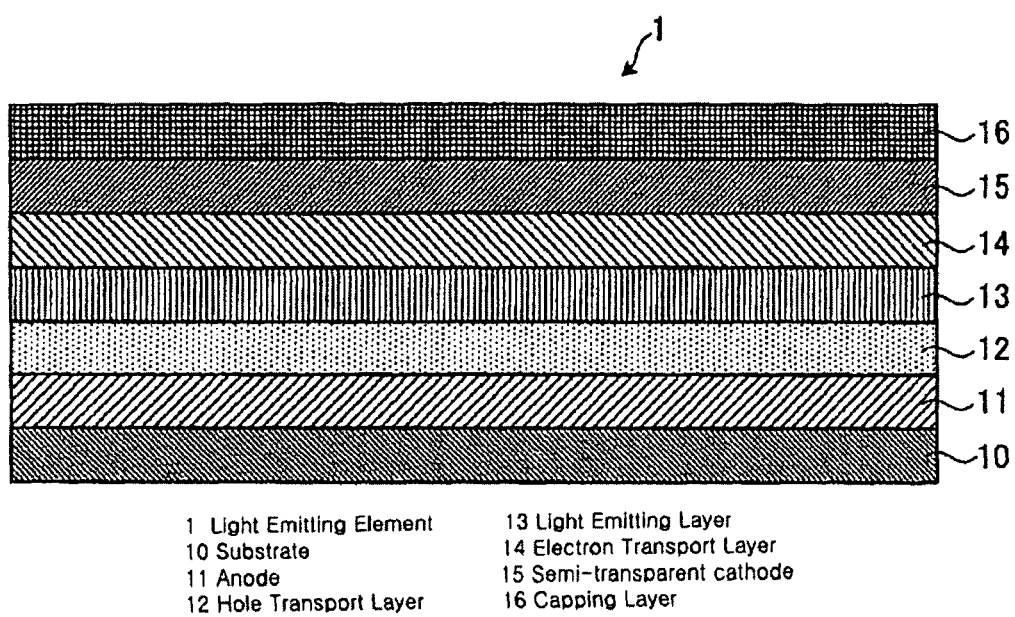
FIG. 1 is a sectional view for illustrating a structure of a light emitting element according to first embodiment of the present invention.

First, a light emitting element of the first embodiment will be described. FIG. 1 is a side sectional view for illustrating a light emitting element according to an embodiment of the present invention. In FIG. 1, a light emitting element 1 has a top emission structure, where an anode 11 as a first electrode made of metal, a hole transport layer 12, a light emitting layer 13, a electron transport layer 14, a semi-transparent cathode 15 as a second electrode, and a capping layer 16 are sequentially laminated onto a substrate such as glass substrate 10.

In the light emitting element 1 with a top emission structure, the glass substrate 10 may not be necessarily transparent. The hole transport layer 12 transports holes from the anode 11 to the light emitting layer 13. The electron transport layer 14 transports electrons from the semi-transparent cathode 15 to the light emitting layer 13. When holes from the hole transport layer 12 and electrons from the electron transport layer 14 are recombined in the light emitting layer 13, the electrons of the organic material in the light emitting layer 13 transit to the excited state such as the singlet excited state and/or triplet excited state, and then when being returned to the stable ground state from the excited state, the light emitting layer 13 emits fluorescent or phosphorescent light.

The capping layer 16 is made of a material which can form a layer reliably at a lower temperature and is composed of the material which does not show a major absorption at a wavelength range of each of blue, green, and red. The material constituting the capping layer 16 will be described later.

The sum of thickness of the above mentioned anode 11, the hole transport layer 12, the light emitting layer 13, the electron transport layer 14, and the semi-transparent cathode 15 is in the range of about 200 nm to 600 nm. And the thickness of the capping layer 16 is preferably in the range of 30 nm to 120 nm, for example. When the capping layer 16 has the thickness of the above mentioned range, high light extraction efficiency can be obtained. Further, the thickness of the capping layer 16 can be properly changed depending on the kind of the light emitting material used for light emitting element, the thickness of the layers constituting light emitting element other than the capping layer 16, and so on. Materials for the semi-transparent cathode 16 include Ca/Mg, MgAg, MgAl, ITO, IZO, and so on.

From the aspect of assuring density of a layer and high step coverage, chemical methods such as CVD (Chemical Vapor Deposition) method are preferably used for forming a layer. Also, other than CVD method, for example, vacuum deposition method can be applied. Also, thermal deposition method, inkjet method or gravure printing, and the like can be applied.

Further, the present invention is not limited to the light emitting element 1 with top emission structure described in FIG. 1, but can be applied to a light emitting element with bottom emission structure or a light emitting element with dual emission structure which emits the light from both the upper part and the bottom part. In these cases, an electrode which is disposed in the direction of extracting light from the light emitting element to the outside, need to be transparent or semi-transparent.

Also, FIG. 1 describes an example having a three-layer structure comprising a hole transport layer 12, a light emitting layer 13, and an electron transport layer 14, which are interposed between an anode 11 and a semi-transparent cathode 15. However, the structure between the anode 11 and the semi-transparent cathode 15 is not limited to the three layer structure. Various structures such as a five-layer structure comprising hole injection layer and electron injection layer additionally, a four-layer structure, a two-layer structure, and a one-layer structure comprising only light emitting layer, can also be applied to the light emitting element, depending on various conditions.

Preferably, the refractive index of the material constituting the capping layer 16 is higher than the refractive index of the electrode adjacent to the capping layer. That is, although the light extraction efficiency of the light emitting element 1 is improved by the capping layer 16, it is more effective when a reflectance is higher at the interface between the capping layer 16 and the material adjacent to the capping layer 16 due to the large light interference effect. For this reason, the refractive index of the material constituting the capping layer 16 is preferably higher than the adjacent electrode and more preferably 1.5 or higher.

Figure 2:
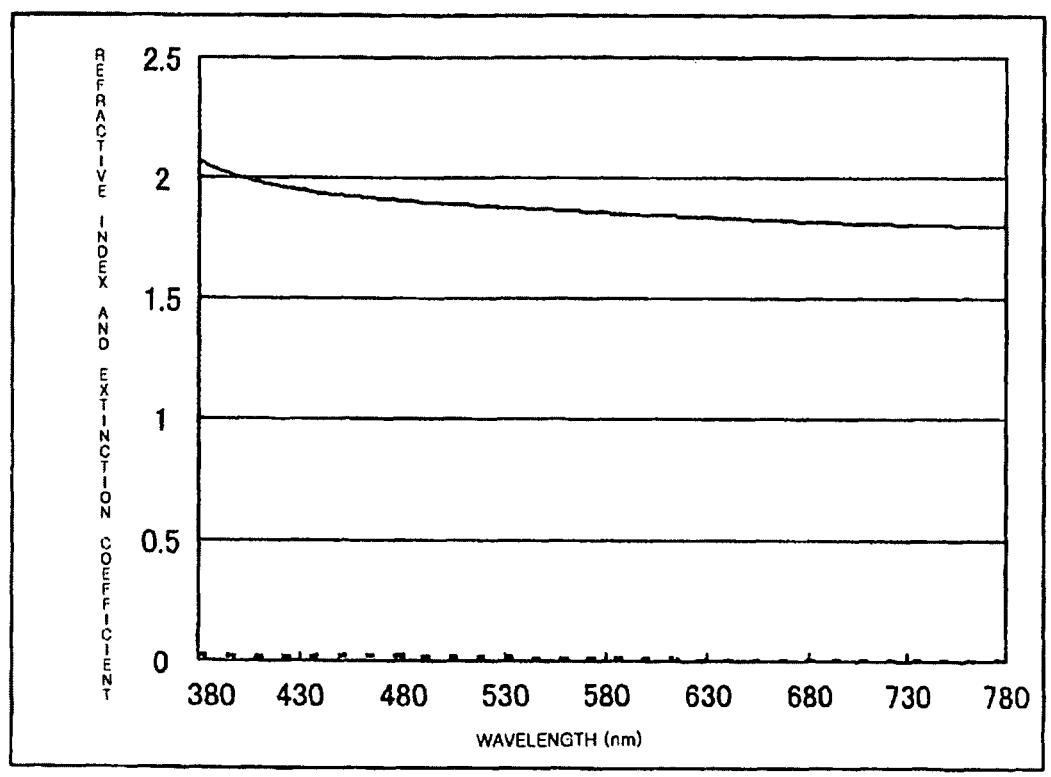
FIG. 2 is a graph for showing the relation of refractive index and extinction coefficient to wavelength in capping layer using CBP.

FIG. 2 is a graph for showing the relation of refractive index and extinction coefficient to wavelength in capping layer using CBP represented by formula (7) described below. A solid line depicts the refractive index and a broken line depicts the extinction coefficient in the drawing. The refractive index means the value of real part of complex refractive index, and extinction coefficient means the value of imaginary part of complex refractive index. For the determination of refractive index and extinction coefficient, n & k method is used, which is well-known. As shown in the drawing, the refractive index of CBP is about 1.75 or higher at every wavelength. Major extinction does not occur at about 450 nm which is used for blue light emitted by blue light emitting element. Also, major extinction does not occur at other wavelength and the extinction coefficient of the capping layer is 0.12 or lower at 380 nm to 780 nm of wavelength range of the light which transmits the capping layer. Accordingly, major absorption does not occur at wavelength range of each of blue, green, and red, and the light emitting element having the capping layer is applied to full color displays desirably.

A bandgap of the material constituting the capping layer 16 is preferably 3.2 eV or higher. A bandgap of 3.2 eV corresponds to about 387 nm of light wavelength and 3.1 eV corresponds to about 400 nm. Accordingly, in order to keep the capping layer 16 transparent within almost full range of visible part (that is, 380 nm to 780 nm,) a bandgap of the material constituting the capping layer 16 is preferably 3.2 eV or higher. A bandgap below 3.2 eV has influence on the wavelength of blue color.

More particularly, the higher a bandgap of the material constituting the capping layer 16 is, the closer an optical absorption edge of the electron transiting within the bandgap moves to short wavelength side. Accordingly, the higher the bandgap of the material is, the more the deviation of the optical absorption edge from the visible part is, thereby the optical absorption of the material lessens to be transparent. Since the material constituting the capping layer 16 is desirably transparent within almost full wavelength range of the visible part, a higher bandgap of the material is preferable. It is more preferable that a bandgap of the material be 3.2 eV or higher since the optical absorption edge is out of the visible part.

The bandgap of the material constituting the capping layer 16 can be obtained by measuring the wavelength of absorption edge in the optical absorption spectrum where the absorption edge is positioned on long wavelength side As the material constituting the capping layer 16, triarylamine derivatives can be used. Examples of the triarylamine derivatives include N,N'-Bis(3-methylphenyl)-N,N'-diphenylbenzidine (hereinafter, referred to as "TPD") represented by formula (1), 4,4',4"-tris[(3-methylphenyl)phenylamino] triphenylamine (hereinafter, referred to as "m-MTDATA") represented by formula (2), 1,3,5-tris[N,N-bis(2-methylphenyl)-amino]-benzene (hereinafter, referred to as "o-MTDAB") represented by formula (3), 1,3,5-tris[N,N-bis (3-methylphenyl)-amino]-benzene (hereinafter, referred to as "m-MTDAB") represented by formula (4), 1,3,5-tris[N,N-bis (4-methylphenyl)-amino]-benzene (hereinafter, referred to as "p-MTDAB") represented by formula (5), and 4,4'-bis[N,N-bis(3-methylphenyl)-amino]-diphenylmethane (hereinafter, referred to as "BPPM") represented by formula (6). These materials can be used alone or in combination with more than one material.

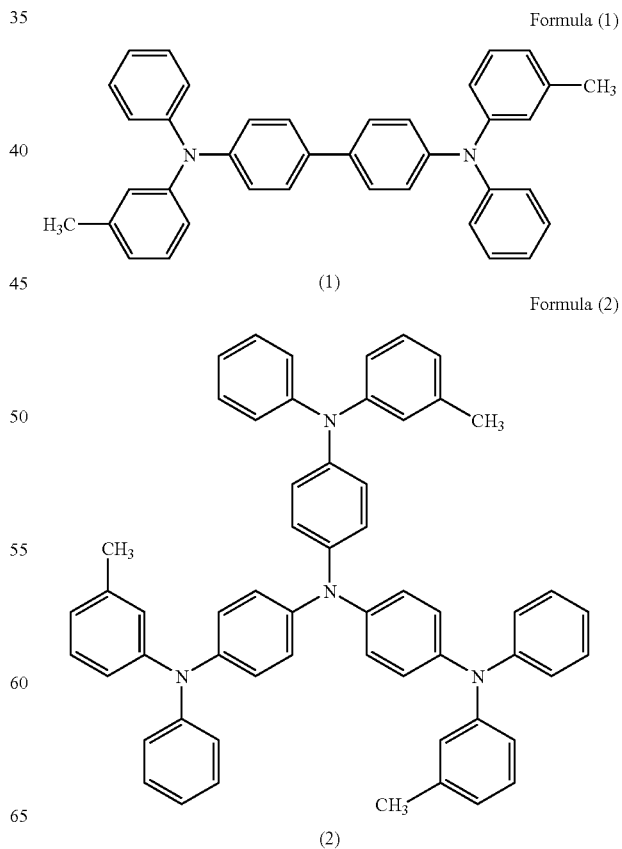

-continued

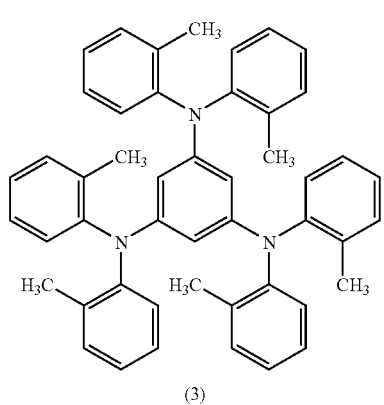

Formula (3)

(3)

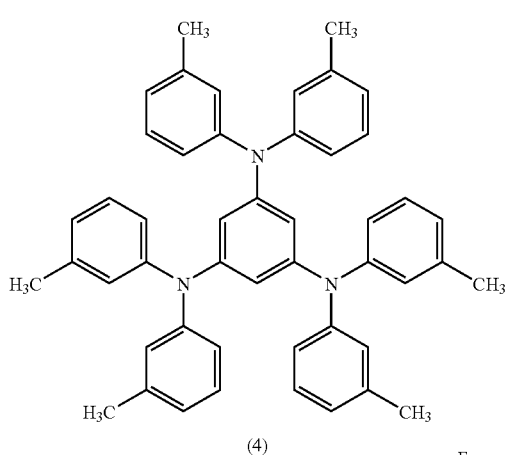

Formula (4)

(4)

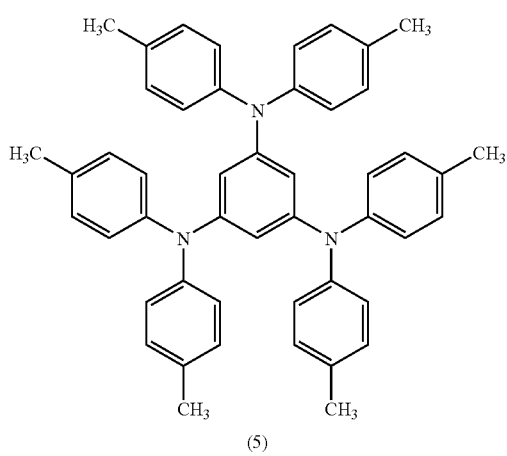

Formula (5)

(5)

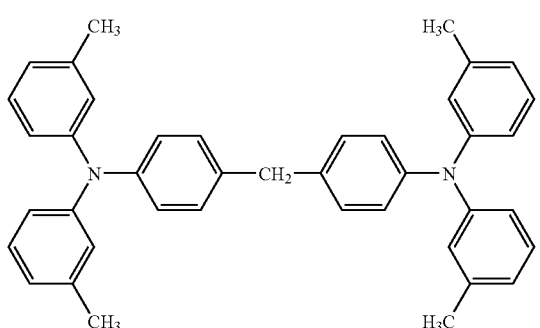

Formula (6)

(6)

For the capping layer 16, triphenylamine derivatives can be used like triarylamine derivatives.

As another material constituting the capping layer 16, carbazole derivatives can be used. Examples of the carbazole derivatives include 4,4'-N,N'-dicarbazol-biphenyl (hereinafter, referred to as "CBP") represented by formula (7) and 4'4',4"-tris(carbazol-9-yl)-triphenylamine (hereinafter, referred to as "TCTA") represented by formula (8). These materials can be used alone or in combination with more than one material.

Formula (7)

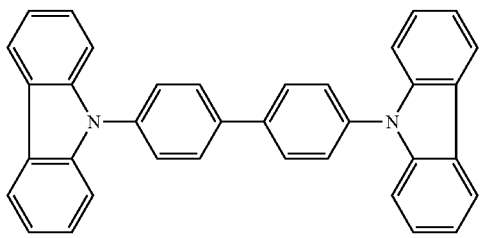

(7)

Formula (8)

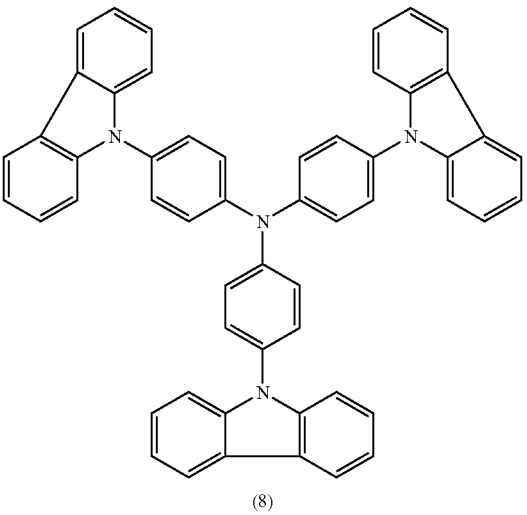

(8)

As another material constituting the capping layer 16, benzimidazole derivatives can be used. Examples of the benzimidazole derivatives include 2,2',2"-(1,3,5-phenylene)tris-[1-phenyl-1H-benzimidazole] (hereinafter, referred to as "TPBI") represented by formula (9).

Formula (9)

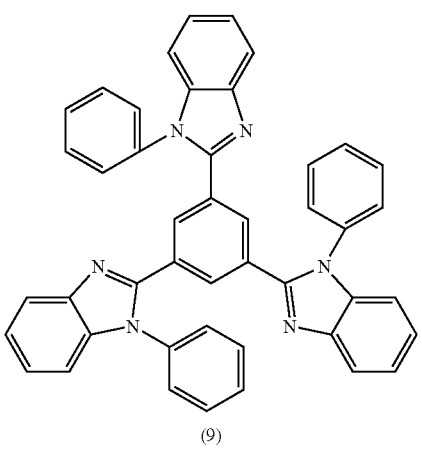

(9)

As another material constituting the capping layer 16, triazole derivatives can be used. Examples of the triazole derivatives include 3-(4-biphenyl)-4-phenyl-5-t-butylphenyl-1,2,4-triazole (hereinafter, referred to as "TAZ") represented by formula (10).

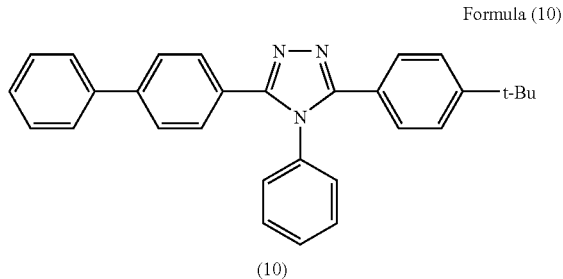 [SMILES: CC(C)(C)c1ccc(-c2nnc(-c3ccc(-c4ccccc4)cc3)n2-c2ccccc2)cc1]

(10)

Also, the materials constituting the capping layer 16 with a bandgap of 3.2 eV or higher, include TPD (3.2 eV), m-MTDATA (3.2 eV), TAZ (4.0 eV), and so on. As for a material constituting the capping layer 16 with a bandgap below 3.2 eV, $Alq_3$, $Almq_3$, CuPc, and so on are enumerated.

According to the first embodiment, a light emitting element comprises a capping layer which is provided on the outside of a transparent or semi-transparent electrode, with higher refractive index than the semi-transparent electrode. Therefore, the light emitting element can improve light extraction efficiency. Moreover, since the capping layer can be formed at temperature of 500° C. or lower by using compounds such as triarylamine derivative and/or carbazole derivative for the capping layer, the light extraction efficiency of each color can be optimized without the major damage to the light emitting element by using a mask with high accuracy. The light emitting element can be applied to full-color displays desirably, and a bright image with high color purity and high resolution can be displayed.

[Light Emitting Device]

Figure 3:
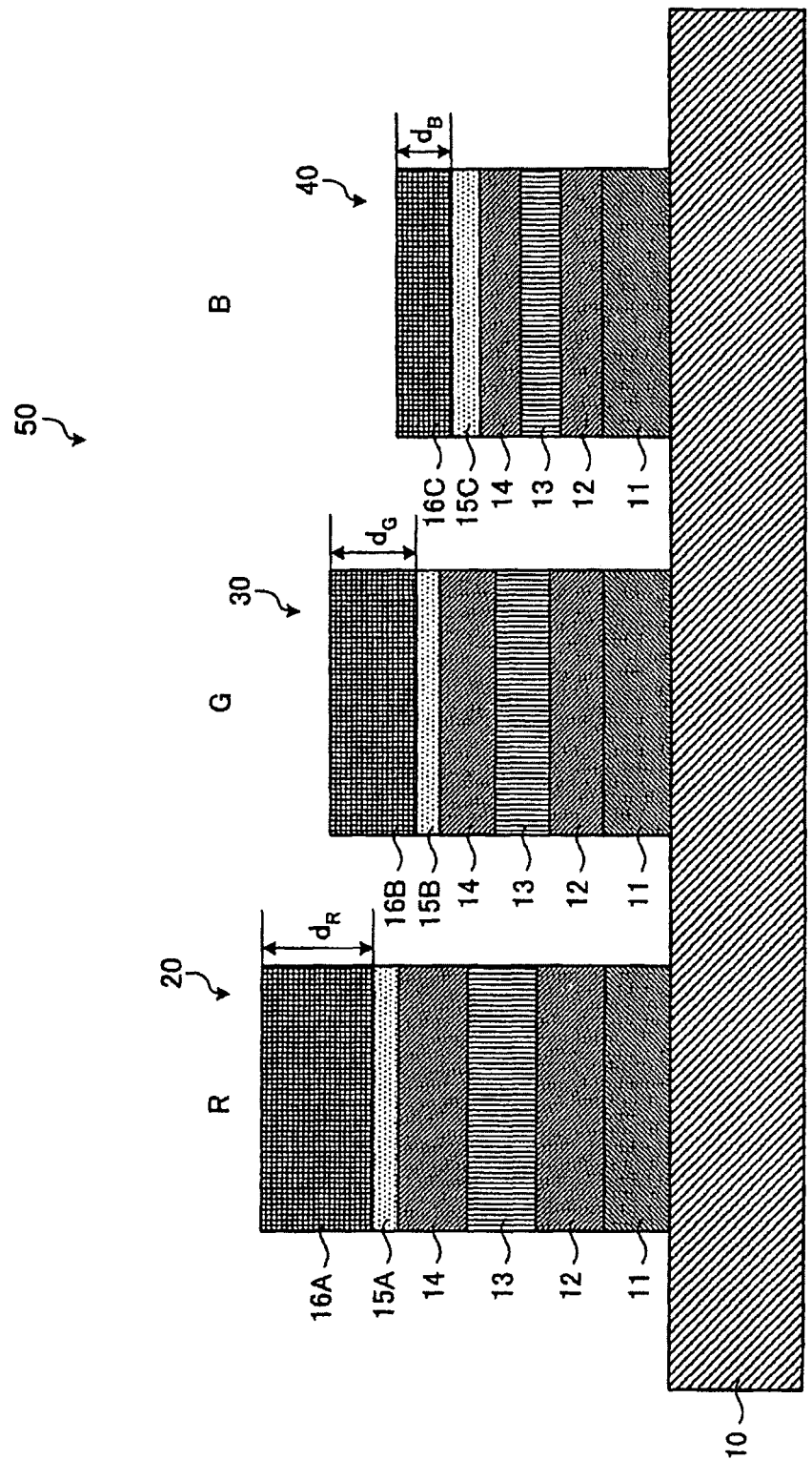
FIG. 3 is a side sectional view for illustrating a light emitting device according to second embodiment of the present invention.

Next, a light emitting device of the second embodiment of the present invention will be described. FIG. 3 is a side sectional view for illustrating a light emitting device according to the second embodiment of the present invention. In FIG. 3, a light emitting device 50 comprises a substrate 10, a first light emitting element 20, a second light emitting element 30, and a third light emitting element 40. These light emitting elements 20, 30 and 40 are provided on the substrate 10.

Each of the first light emitting element 20, the second light emitting element 30, and the third light emitting element 40 comprises an anode 11 as a first electrode, a hole transport layer 12, a light emitting layer 13, a electron transport layer 14, a semi-transparent cathode 15A, 15B, and 15C, respectively, as a second electrode, and a capping layer 16A, 16B, and 16C, respectively, which are sequentially laminated in the same way as the light emitting element 1 described in FIG. 1.

The first light emitting element 20, the second light emitting element 30, and the third light emitting element 40 emit red light, green light, and blue light, respectively. The capping layers 16A, 16B, and 16C may be made of a homogeneous material or heterogeneous material. If the capping layers 16A, 16B, and 16C are made of a homogeneous material, time and cost for forming the capping layers 16A, 16B, and 16C can be reduced, thereby contributing to productivity improvement or cost reduction of the light emitting device 50.

The thickness of the capping layers 16A, 16B, and 16C may be same or different. When the thickness of the capping layer 16A of the first light emitting element 20 is $d_R$, the thickness of the capping layer 16B of the second light emitting element 30 is $d_G$, and the thickness of the capping layer 16C of the third light emitting element 40 is $d_B$, it is preferable that the formula of $d_R > d_G > d_B$ be satisfied. Red color has the longest wavelength and blue color has the shortest wavelength among red, blue, and green color. Therefore, the thickness of the capping layers 16A, 16B, and 16C may be determined depending on the wavelength of the light they emit, to improve light extraction efficiency of the first light emitting element 20 to the third light emitting element 40 corresponding to each color more.

Also, the description about the light emitting element in the first embodiment including materials for the capping layer, layer thickness or bandgap, and refractive index are equally applied to the first light emitting element 20, the second light emitting element 30, and the third light emitting element 40 in the light emitting device 50. Further, the number of the light emitting element is not limited to three, and a plurality of light emitting elements can be provided additionally on the same substrate, or on the different substrate.

[Method for Manufacturing Light Emitting Device]

Figure 4:
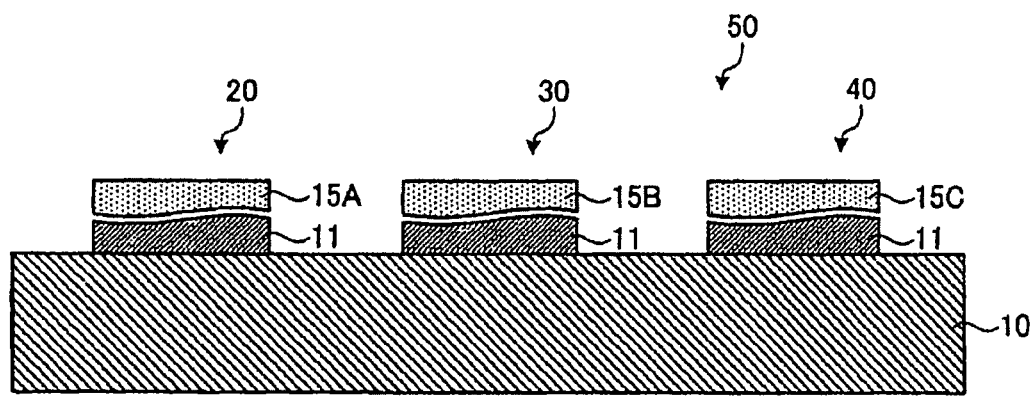
FIG. 4 is a side sectional view for explaining a method for manufacturing a light emitting device according to third embodiment of the present invention.
Figure 5:
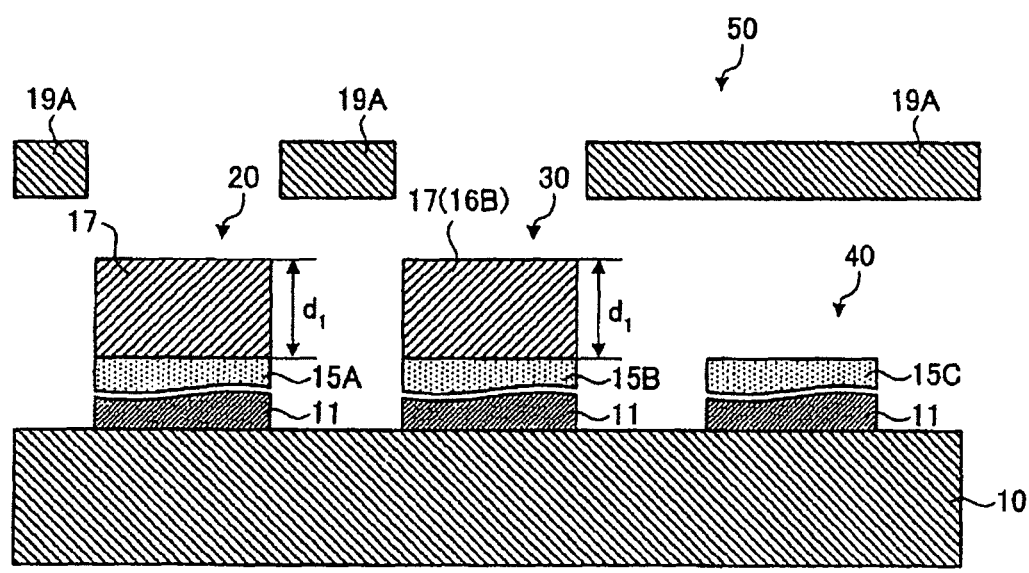
FIG. 5 is a side sectional view for explaining a method for manufacturing a light emitting device according to the third embodiment.
Figure 6:
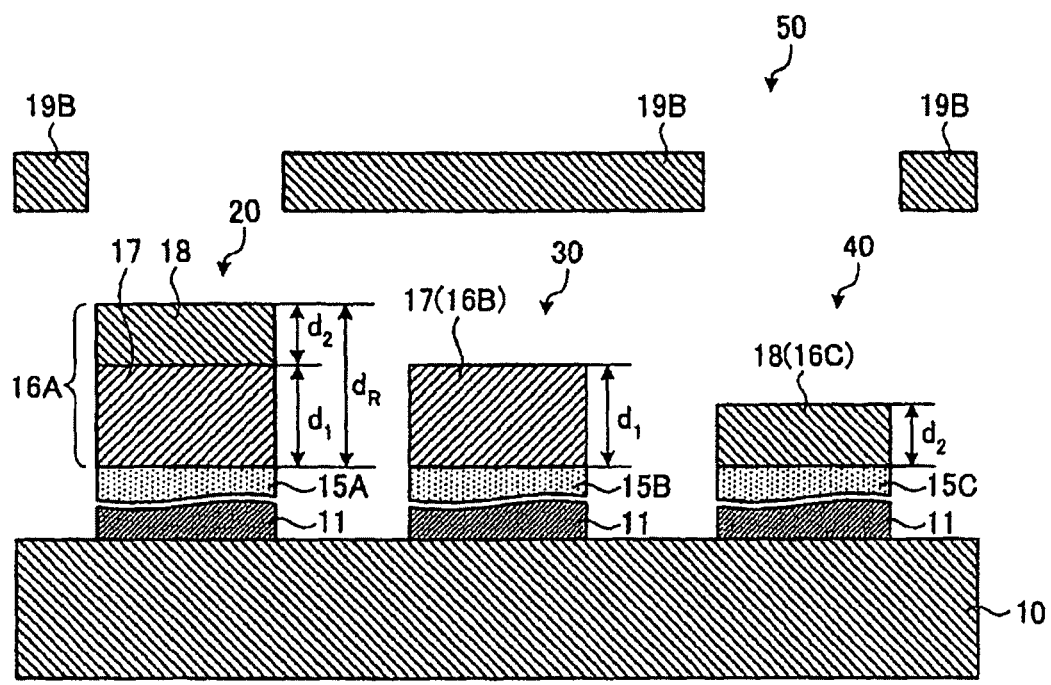
FIG. 6 is a side sectional view for explaining a method for manufacturing a light emitting device according to the third embodiment.

Next, a method for manufacturing a light emitting device of third embodiment of the present invention will be described. FIG. 4 to FIG. 6 are side sectional views for explaining a method for manufacturing a light emitting device according to the third embodiment of the present invention. In these figures, the illustration between semi-transparent cathode 15A, 15B, and 15C and anode 11 is simplified, to make the explanation easier to understand.

In FIG. 4, a light emitting device 50 comprises a substrate 10, a first light emitting element 20, a second light emitting element 30, and a third light emitting element 40. These light emitting elements 20, 30, and 40 are provided on the same substrate 10. Each of the first light emitting element 20, the second light emitting element 30, and the third light emitting element 40 comprises an anode 11 as a first electrode, a hole transport layer 12, a light emitting layer 13, a electron transport layer 14, and a semi-transparent cathode 15A, 15B, and 15C, respectively, as a second electrode, which are sequentially laminated in the same way as the light emitting element 1 described in FIG. 1.

When the capping layers 16A, 16B, and 16C are formed of a homogeneous material to have different thickness, as illustrated in FIG. 5, the material for constituting a capping layer is laminated onto the semi-transparent cathodes (15A and 15B) in the first light emitting element 20 and the second light emitting element 30, respectively, by mask deposition method using a deposition mask 19A such as shadow mask, and then a first layer 17 made of the material is formed to have layer thickness $d_1$. In this case, the first layer 17 is formed as a semi-formed layer 17 of the capping layer, since in the next step, the same material is laminated onto the first layer 17 which is made of the material for constituting capping layer and formed onto the semi-transparent cathode 15A in the first light emitting element 20. On the other hand, the first layer 17 formed on the semi-transparent cathode 15B in the second light emitting element 30 is the capping layer 16B itself.

Next, as illustrated in FIG. 6, a second layer 18 made of the material constituting capping layer is formed on the first layer 17 in the first light emitting element 20 and on the semi-transparent cathode 15C in the third light emitting element 40, respectively, by mask deposition method using a deposition mask 19B. The second layer 18 is formed to have a layer thickness $d_2$. In the first light emitting element 20, the capping layer 16A consists of the first layer 17 and the second layer 18 formed thereon. On the other hand, in the third light emitting element 40, the second layer 18 formed onto the semi-transparent cathode 15C, is the capping layer 16C itself.

Since the capping layer 16A in the first light emitting element 20 consists of the first layer 17 and the second layer 18 formed thereon, when the thickness of the capping layer 16A is $d_R$, the formula of $d_R=d_1+d_2$ is satisfied. In other words, the thickness of the capping layer 16A in the first light emitting element 20 is substantially the same as the sum of the thickness $d_1$ of the capping layer 16B in the second light emitting element 30 and the thickness $d_2$ of the capping layer 16C in the third light emitting element 40. However, the sum of the thickness may not be the same value as the formula depending on the condition of deposition, but may be within 10% with respect to the thickness $d_R$ of the capping layer 16A.

In this way, the capping layers 16A, 16B, and 16C having different layer thickness are formed through two steps. In the case that the capping layers 16A, 16B, and 16C are made of a homogeneous material and have different layer thickness, the two-step method is more simplified in comparison with the three-step method where each of the capping layers 16A, 16B, and 16C is formed by a separate step. As a result, the two-step method can contribute to the productivity improvement of the light emitting device. Also, the descriptions about the light emitting element in the first embodiment and light emitting device in the second embodiment are equally applied to the light emitting device described on the basis of FIG. 4 through FIG. 6.

EXAMPLE

The example of the present invention will be explained more specifically. A red light emitting element of the present invention has been manufactured as below. First, Ni anode with layer thickness of 100 nm was laminated by sputtering method onto the substrate and then copper phthalocyanine (CuPc) with layer thickness of 20 nm as a hole injection layer was laminated through deposition method onto the Ni anode. Subsequently, N,N'-di(naphthalene-1-yl)-N,N'-diphenyl-benzidine (NPB) with layer thickness of 40 nm as a hole transport layer was laminated through deposition method. And then, $Alq_3$ and 4-(dicyanomethylene)-2-t-butyl-6-(1,1,7,7,-tetramethyljulolidyl-9-enyl)-4H-pyran (DCJTB) as a light emitting layer were deposited by dual deposition. The layer thickness of $Alq_3$ was 30 nm and 1% of DCJTB as the volume ratio was laminated simultaneously.

Then, $Alq_3$ with layer thickness of 40 nm as an electron transport layer, and Ca with layer thickness of 12 nm and Mg with layer thickness of 12 nm as a cathode were laminated sequentially through deposition method. Finally, CBP as a capping layer was laminated through deposition method, changing the layer thickness in the range of from 0 nm to 100 nm. The method for forming red pixel is described above, however, green and blue pixel can be formed by substantially the same method except for the thickness and material of the layer. To form a red, green, and blue pixel of which the position is selected respectively for the forming, a metal mask having an opening at the position of laminating is aligned precisely to a substrate, and then the metal mask is contacted to the side of the main surface of the substrate which is to be deposited, and finally the layers are deposited.

Figure 7:
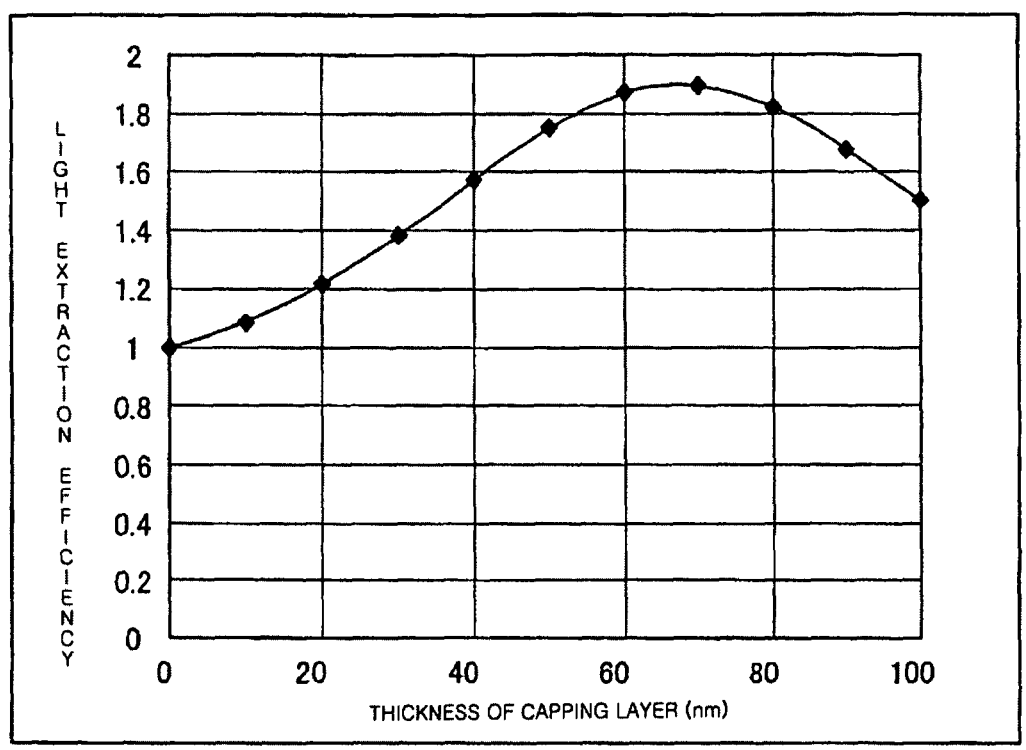
FIG. 7 is a graph for showing the relationship between thickness of capping layer and light extraction efficiency according to an example.
Figure 8:
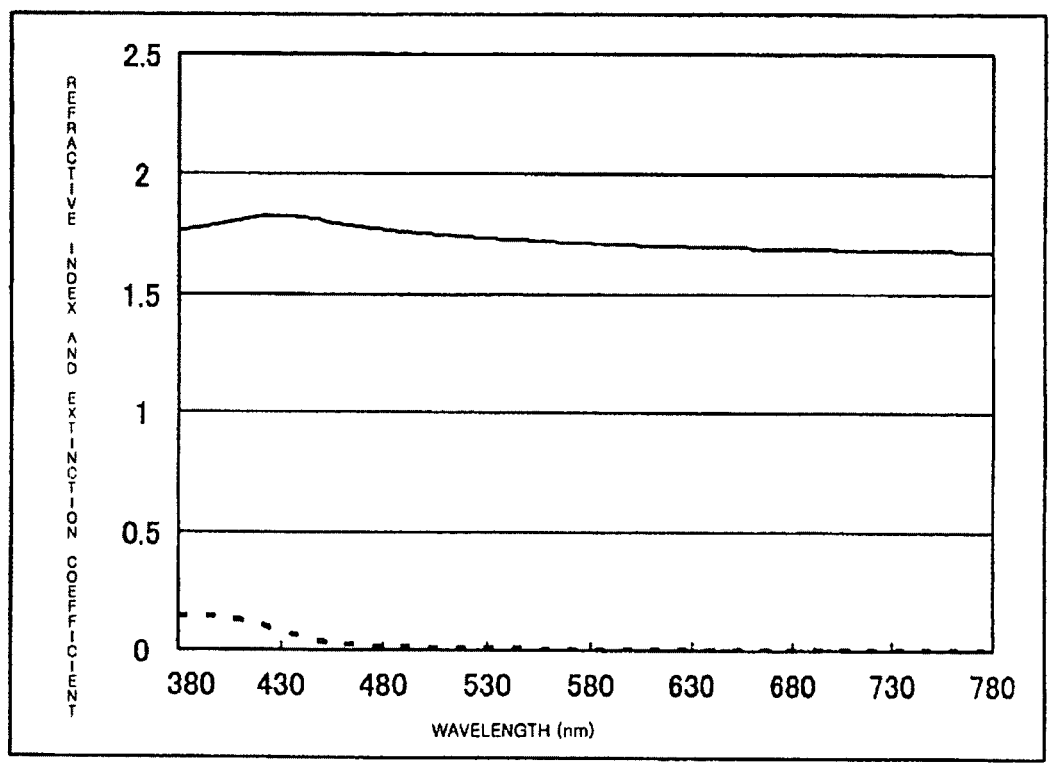
FIG. 8 is a graph for showing the relation of refractive index and extinction coefficient to wavelength in the related technology.

The light extraction efficiency of the red light emitting elements which have been manufactured to have capping layers with different thickness, were determined. FIG. 7 shows the result. As clear from FIG. 7, the capping layer with layer thickness of 70 nm showed the highest light extraction efficiency, which is 1.9 times higher than the light extraction efficiency in the case of a light emitting element without the capping layer. The capping layers with layer thickness between 50 nm and 90 nm showed light extraction efficiency is 1.6 times or more higher than the light extraction efficiency in the case of a light emitting element without the capping layer, and the capping layers with layer thickness between 60 nm and 80 nm showed light extraction efficiency is 1.8 times or more higher than the light extraction efficiency in the case of a light emitting element without the capping layer. These results showed great improvement.

As described above, the light emitting element, the light emitting device comprising the light emitting element, and the method for manufacturing the same according to the embodiments, comprise the capping layer made of the material which can form the layer at a lower temperature reliably and does not show an major absorption at a wavelength range of blue, green, and red respectively. Therefore, they can be preferably applied to full color displays, to display a bright image with high color purity and high resolution.

The invention claimed is:

1. A light emitting device comprising:
 a plurality of light emitting elements, each of which comprises
  a first electrode;
  a second electrode configured to transmit light;
  an organic layer arranged between the first electrode and the second electrode and comprising a light emitting layer; and
  a capping layer arranged on the second electrode and made of a material with a higher refractive index than the refractive index of the material constituting the second electrode and with a bandgap of 3.2 eV or higher,
 wherein the material constituting the capping layer comprises at least one compound selected from the group consisting of a triarylamine derivative, a carbazole derivative, a benzimidazole derivative and a triazole derivative,
 wherein the capping layer is arranged so that the second electrode is arranged between the organic layer and the capping layer,
 wherein the light emitting elements are classified into a first light emitting element emitting red light, a second light emitting element emitting green light, and a third light emitting element emitting blue light,
 wherein the thickness of the capping layer of the first light emitting element ($d_1+d_2$), the thickness of the capping layer of the second light emitting element ($d_1$), and the thickness of the capping layer of the third light emitting element ($d_2$) satisfy the formula $d_1>d_2$, and
 wherein the thickness of the capping layer of the first light emitting element ($d_1+d_2$) is within 10% with respect to the sum of the thickness of the capping layer of the second light emitting element ($d_1$) and the thickness of the capping layer of the third light emitting element ($d_2$).

2. The light emitting device according to claim 1, wherein the material constituting the capping layer comprises a triphenylamine derivative.

3. The light emitting device according to claim 1, wherein the material constituting the capping layer comprises at least one compound selected from the group consisting of N,N'-Bis(3-methylphenyl)-N,N'-diphenylbenzidine (TPD), 4,4',4"-tris[(3-methylphenyl)phenylamino]triphenylamine (m-MTDATA), 1,3,5-tris[N,N-bis(2-methylphenyl)-amino]-benzene (o-MTDAB), 1,3,5-tris[N,N-bis(3-methylphenyl)-amino]-benzene (m-MTDAB), 1,3,5-tris[N,N-bis(4-methylphenyl)-amino]-benzene (p-MTDAB), and 4,4'-bis[N,N-bis(3-methylphenyl)-amino]-diphenylmethane (BPPM).

4. The light emitting device according to claim 1, wherein the material constituting the capping layer comprises at least one compound selected from the group consisting of 4,4'-N, N'-dicarbazol-biphenyl (CBP), 4'4',4"-tris(carbazol-9-yl)-triphenylamine (TCTA), 2,2',2"-(1,3,5-phenylene)tris-[1-phenyl-1H-benzimidazole] (TPBI), and 3-(4-biphenyl)-4-phenyl-5-tert-butylphenyl-1,2,4-triazole (TAZ).

5. The light emitting device according to claim 1, wherein the thickness of the capping layer is in the range of 30 nm to 120 nm 6. The light emitting device according to claim 1, wherein the refractive index of the capping layer is 1.75 or higher when the wavelength of the light transmitting through the capping layer is in the range of 380 nm to 780 nm.

7. The light emitting device according to claim 1, wherein the extinction coefficient of the capping layer is 0.12 or lower when the wavelength of the light transmitting through the capping layer is in the range of 380 nm to 780 nm.

8. A method for manufacturing the light emitting device of claim 1, comprising:
- depositing the material constituting the capping layer onto the second electrodes of the first and the second light emitting elements, to form a first layer onto the second electrodes of the first light emitting element, and to form the capping layer onto the second electrode of the second light emitting element respectively; and
- depositing the material constituting the capping layer onto the first layer and onto the second electrode of the third light emitting element respectively, to form the capping layer on the second electrodes of the first and the third light emitting elements.

9. The method for manufacturing the light emitting device according to claim 8, wherein the sum of the thickness of the capping layer of the second and the third light emitting element is substantially the same as the thickness of the capping layer of the first light emitting element.

* * * * *